United States Patent [19]
Amdahl

[11] Patent Number: 5,987,090
[45] Date of Patent: Nov. 16, 1999

[54] METHOD AND APPARATUS FOR A LOGARITHMIC SHIFT REGISTER

[75] Inventor: Gene M. Amdahl, 165 Patricia Dr., Atherton, Calif. 94027

[73] Assignee: Gene M. Amdahl, Atherton, Calif.

[21] Appl. No.: 09/018,272

[22] Filed: Feb. 4, 1998

[51] Int. Cl.$^6$ .................................................. G11C 19/00
[52] U.S. Cl. ................................ 377/77; 377/80; 377/81; 377/73
[58] Field of Search ................................. 377/73, 77, 80, 377/81

[56] References Cited

U.S. PATENT DOCUMENTS

| | | | |
|---|---|---|---|
| 4,688,236 | 8/1987 | DuPoy | 377/49 |
| 5,748,940 | 5/1998 | Johnston | 377/52 |
| 5,842,006 | 11/1998 | Harvey et al. | 377/52 |

Primary Examiner—Margaret R. Wambach
Attorney, Agent, or Firm—Steven F. Caserza; Albritton & Herbert

[57] ABSTRACT

A new class of shift registers that shift the contents of a $2^n$ bit length register up to $2^n-1$ positions in n cycles. Shift registers according to the present invention can be constructed to shift left, shift right, or to shift either left or right. A general implementation of this class of shift registers comprises the following hardware: $2^n$ D flip-flops or D latches for the data register positions of the shift register; logic for each of the $2^n$ positions to determine the input value to which the position should take on at each of the n cycles; an n bit shift count register to store a value indicating the number of positions to shift; control lines specifying whether to shift left or right; n control lines which are sequentially raised for one cycle to select a bit in the shift count register for the current cycle beginning with the most significant bit and continuing sequentially to the least significant bit; and a clock to set the selected input data to each position in the shift register.

12 Claims, 5 Drawing Sheets

TABLE 5A-1

|   | 0 | 0 | 0 |
|---|---|---|---|
| 0 | 0 | 0 | 0 |
| 1 | 4 | 2 | 1 |
| 2 | 1 | 4 | 2 |
| 3 | 5 | 6 | 3 |
| 4 | 2 | 1 | 4 |
| 5 | 6 | 3 | 5 |
| 6 | 3 | 5 | 6 |
| 7 | 7 | 7 | 7 |

TABLE 5A-2

|   | 0 | 0 | 0 |
|---|---|---|---|
| 0 | 0 | 0 | 7 |
| 1 | 4 | 2 | 0 |
| 2 | 1 | 4 | 1 |
| 3 | 5 | 6 | 2 |
| 4 | 2 | 1 | 3 |
| 5 | 6 | 3 | 4 |
| 6 | 3 | 5 | 5 |
| 7 | 7 | 7 | 6 |

TABLE 5A-3

|   | 0 | 0 | 0 |
|---|---|---|---|
| 0 | 0 | 7 | 7 |
| 1 | 4 | 0 | 6 |
| 2 | 1 | 2 | 0 |
| 3 | 5 | 4 | 1 |
| 4 | 2 | 6 | 2 |
| 5 | 6 | 1 | 3 |
| 6 | 3 | 3 | 4 |
| 7 | 7 | 5 | 5 |

TABLE 5A-4

|   | 0 | 1 | 1 |
|---|---|---|---|
| 0 | 0 | 7 | 5 |
| 1 | 4 | 0 | 7 |
| 2 | 1 | 2 | 6 |
| 3 | 5 | 4 | 0 |
| 4 | 2 | 6 | 1 |
| 5 | 6 | 1 | 2 |
| 6 | 3 | 3 | 3 |
| 7 | 7 | 5 | 4 |

TABLE 5A-5

|   | 1 | 0 | 0 |
|---|---|---|---|
| 0 | 7 | 7 | 7 |
| 1 | 0 | 5 | 4 |
| 2 | 4 | 0 | 5 |
| 3 | 1 | 2 | 6 |
| 4 | 5 | 4 | 0 |
| 5 | 2 | 6 | 1 |
| 6 | 6 | 1 | 2 |
| 7 | 3 | 3 | 3 |

TABLE 5A-6

|   | 1 | 0 | 1 |
|---|---|---|---|
| 0 | 7 | 7 | 3 |
| 1 | 0 | 5 | 7 |
| 2 | 4 | 0 | 4 |
| 3 | 1 | 2 | 5 |
| 4 | 5 | 4 | 6 |
| 5 | 2 | 6 | 0 |
| 6 | 6 | 1 | 1 |
| 7 | 3 | 3 | 2 |

TABLE 5A-7

|   | 1 | 1 | 0 |
|---|---|---|---|
| 0 | 7 | 3 | 3 |
| 1 | 0 | 7 | 2 |
| 2 | 4 | 5 | 7 |
| 3 | 1 | 0 | 4 |
| 4 | 5 | 2 | 5 |
| 5 | 2 | 4 | 6 |
| 6 | 6 | 6 | 0 |
| 7 | 3 | 1 | 1 |

TABLE 5A-8

|   | 1 | 1 | 1 |
|---|---|---|---|
| 0 | 7 | 3 | 1 |
| 1 | 0 | 7 | 3 |
| 2 | 4 | 5 | 2 |
| 3 | 1 | 0 | 7 |
| 4 | 5 | 2 | 4 |
| 5 | 2 | 4 | 5 |
| 6 | 6 | 6 | 6 |
| 7 | 3 | 1 | 0 |

FIG. 5A

TABLE 5B-1

|   | 0 | 0 |
|---|---|---|
| 0 | 0 | 0 |
| 1 | 2 | 1 |
| 2 | 1 | 2 |
| 3 | 3 | 3 |

TABLE 5B-2

|   | 0 | 1 |
|---|---|---|
| 0 | 0 | 3 |
| 1 | 2 | 0 |
| 2 | 1 | 1 |
| 3 | 3 | 2 |

TABLE 5B-3

|   | 1 | 0 |
|---|---|---|
| 0 | 3 | 3 |
| 1 | 0 | 2 |
| 2 | 2 | 0 |
| 3 | 1 | 1 |

TABLE 5B-3

|   | 1 | 1 |
|---|---|---|
| 0 | 3 | 1 |
| 1 | 0 | 3 |
| 2 | 2 | 2 |
| 3 | 1 | 0 |

FIG. 5B

METHOD AND APPARATUS FOR A LOGARITHMIC SHIFT REGISTER

This invention pertains to digital electronics, and more particularly to a new class of shift registers.

BACKGROUND

Shift registers are widely used in digital electronics. Shift registers shift the values in a series of registers a defined number of positions either to the left or to the right as determined by a control signal. A common application of shift registers is to convert data between serial and parallel formats. Data can be loaded into a shift register in parallel and then shifted out of the register one bit at time serially, and data can also be loaded into a shift register serially and output from the shift register can be provided in parallel format.

Serial shift registers are comprised of a series of interconnected flip-flops or latches that form registers. At each clock cycle the value in each register is shifted to the adjacent register. A control signal determines whether the register values are shifted to the left or to the right. A major drawback of serial shift registers is that serial shift registers only shift one register location per clock cycle. Therefore, to shift seven positions requires seven clock cycles.

Parallel shift registers perform the complete shift operation in a single clock cycle. Thus in contrast to a serial shift register where a seven position shift requires seven clock cycles, a parallel shift register performs the seven position shift operation in a single clock cycle. The trade-off for this improved performance is that parallel shift registers require substantially more hardware than serial shift registers. A typical implementation for a parallel shift register uses four layers of AND gates to implement the control logic which moves the register values to the appropriate positions based on the number of positions of the shift operation and the direction of the shift. In addition to the control logic hardware, there is also hardware required for loading new values into the shift register and providing clock control for the different hardware stages.

A new class of shift registers that provides higher performance than serial shift registers and requires less hardware than parallel shift registers would be highly desirable.

SUMMARY

The present invention provides a new class of shift registers that requires substantially less hardware than parallel shift registers, and provides higher performance than serial shift registers. The shift registers of the present invention can shift the contents of a $2^n$ bit length register up to $2^n-1$ positions in n cycles, and are therefore referred to as logarithmic shift registers. By contrast, serial shift registers require a cycle for each position shifted. Shift registers according to the present invention can be constructed to shift left, shift right, or to shift either left or right. The number of cycles to complete the shift is n cycles for a shift register of length $2^n$ bit positions.

A general implementation of this class of shift registers comprises the following hardware: $2^n$ D flip-flops or D latches for the data register positions of the shift register; logic for each of the $2^n$ positions to determine the input value to which the position should take on at each of the n cycles; an n bit shift count register to store a value indicating the number of positions to shift; control lines specifying whether to shift left or right; n control lines which are sequentially raised for one cycle to select a bit in the shift count register for the current cycle beginning with the most significant bit and continuing sequentially to the least significant bit; and a clock to set the selected input data to each position in the shift register.

BRIEF DESCRIPTION OF THE DRAWINGS

FIG. 5A illustrates the shift register mappings for each cycle of a shift left operation for an eight bit shift register for all of the count bit values 000 to 111 according to one embodiment of the present invention.

FIG. 5B illustrates the shift register mappings for each cycle of a shift left operation for a four bit shift register for all of the count bit values 00 to 11 according to one embodiment of the present invention.

DETAILED DESCRIPTION OF THE PREFERRED EMBODIMENTS

The present invention provides a new class of shift registers that requires substantially less hardware than parallel shift registers, and provides higher performance than serial shift registers. The shift registers of the present invention can shift the contents of a $2^n$ bit length register up to $2^n-1$ positions in n cycles, and are therefore referred to as logarithmic shift registers. By contrast, serial shift registers require a cycle for each position shifted. Shift registers according to the present invention can be constructed to shift left, shift right, or to shift either left or right. The number of cycles to complete the shift is n cycles for a register of length $2^n$ bit positions.

Figure 1:
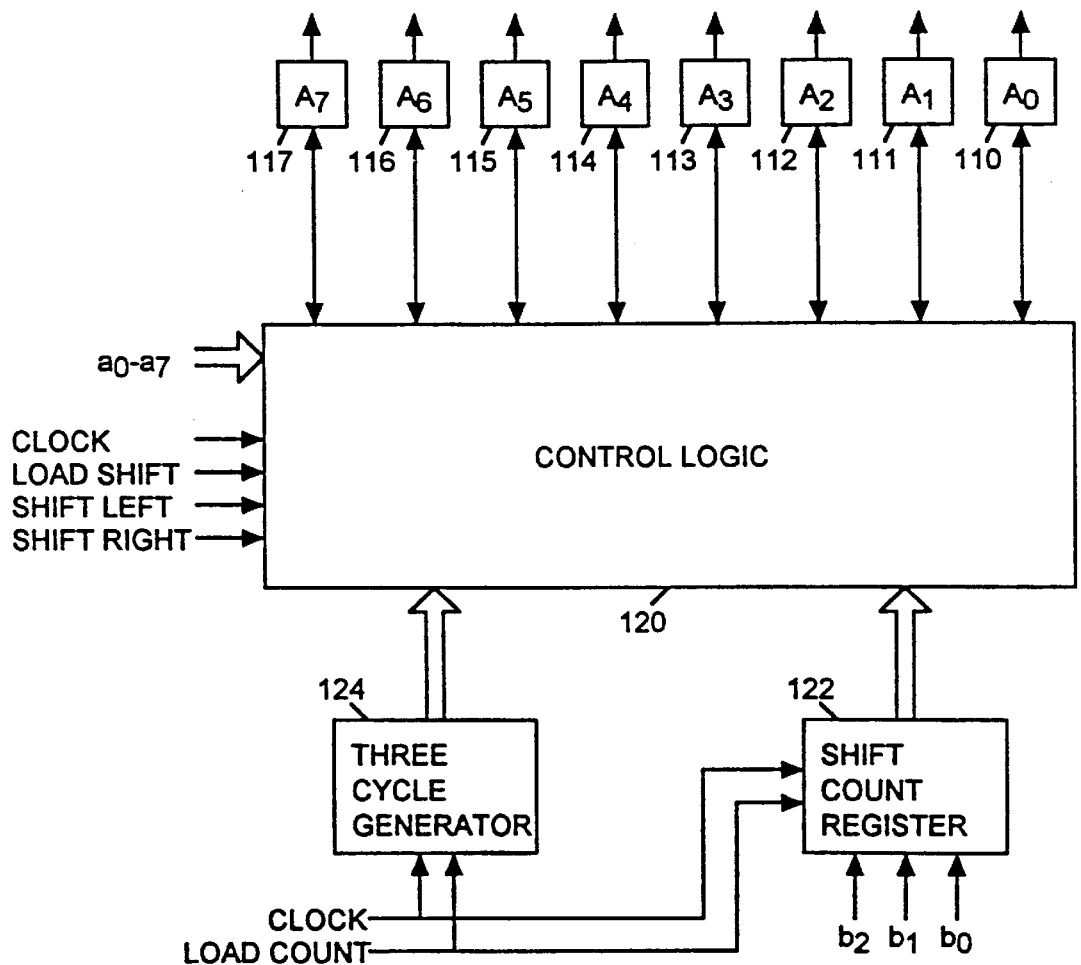
FIG. 1 illustrates a block diagram of an eight bit shift register according to one embodiment of the present invention.

A block diagram of an eight bit shift register according to one embodiment of the present invention is illustrated in FIG. 1. Shift count bits $b_2$, $b_1$ and $b_0$ define the number of shift register positions to shift, and these values are stored in shift count register 122. Control lines shift right and shift left define the shift direction. Data lines $a_0$–$a_7$ provide the values for data registers $A_0$ 110–$A_7$ 117, also referred to as shift register positions.

In operation, the load shift control signal loads the $a_0$–$a_7$ values into data registers $A_0$ 110–$A_7$ 117. The load count signal loads new shift count values $b_2$, $b_1$ and $b_0$ into shift count register 122. Three cycle generator 124 provides three one cycle signals to control logic block 120 over the course of three clock periods. Control logic block 120 executes shift operations in each of the cycles as defined by the shift count bit values stored in shift count register 122 to shift the contents of the eight data registers up to seven positions in three cycles.

According to one embodiment of the present invention the shift position mappings for a $2^n$ bit number are described by the following table:

TABLE 1

| Shift Direction | Count Bit | Sink Position (Modulo $2^n$) | Source Position |
|---|---|---|---|
| Right or Left | 0 | 2i | i |
| Right or Left | 0 | 2i + 1 | $2^{n-1}$ + i |
| Right | 1 | 2i − 1 | i |
| Right | 1 | 2i | $2^{n-1}$ + i |
| Left | 1 | 2i + 1 | i |
| Left | 1 | 2i + 2 | $2^{n-1}$ + i | where i ranges from 0 to $2^{n-1}-1$. These shift mappings describe the shift operations to be performed at each cycle. In a shift operation there is one cycle for each count bit. For an m bit number the initial value is of the form $S_0=(a_{m-1}, a_{m-2}, a_{m-3}, \ldots a_2, a_1, a_0)$ with $m=2^n$ and $a_i=\{0,1\}$. $S_1$ is then the value after the shift count bit n−1 is applied, and $S_j$ is the value after the shift count bit n−j is applied. For example, applying the equations in table 1 for a shift left cycle, the value of data register 3 in an eight bit shift register, i=1 and n=3, for count bit 2=1, is $S_1(a_3)=a_1$ which means the value of data register 1 in the shift register is moved to data register 3 in the shift register. Note that the shift register data registers are labeled from 0 to m−1, thus the fourth bit in the shift register is labeled data register 3. Also note that in any shift left operation the input to data register 0 is zeroed out.

The following table illustrates the shift register source and sink positions for shift left, shift right, and zero shift operations in an eight bit shift register:

TABLE 2

| Source/Sink Position | Shift Register Position | | | | | | | | Count Bit Shift Left/Right |
|---|---|---|---|---|---|---|---|---|---|
| sink position | 7 | 6 | 5 | 4 | 3 | 2 | 1 | 0 | |
| source position | 3 | 6 | 2 | 5 | 1 | 4 | 0 | 7 | count bit = 1 left shift |
| source position | 7 | 3 | 6 | 2 | 5 | 1 | 4 | 0 | count bit = 0 left or right shift |
| source position | 0 | 7 | 3 | 6 | 2 | 5 | 1 | 4 | count bit = 1 right shift |

The source position is the shift register position from which the value is taken, and the sink position is the shift register position to which the value is moved. For example, for a shift left operation with the count bit equal to one, the value of shift register position 5 is moved to shift register position 4. For a right shift operation with the count bit equal to one, the value of shift register position 5 is moved to shift register position 2. The shift mapping defined by Table 2 applies to all shift count bit positions. For example, for an eight bit shift register for a shift count value of 111, the same shift register position mappings are applied for each of the three count bits.

The shift register position contents are also shifted when a count bit is zero. Thus for a shift count value of 100 shift left, in the first clock cycle, the shift left count bit equal to one operations defined by Table 2 are performed. Then in each of the next two clock cycles shift operations for a count bit equal to zero are performed. The end result of these operations is that the contents of the shift register are shifted to the left four shift register positions. The same shift operations are performed for a zero count bit value for both shift left and shift right operations.

Figure 3:
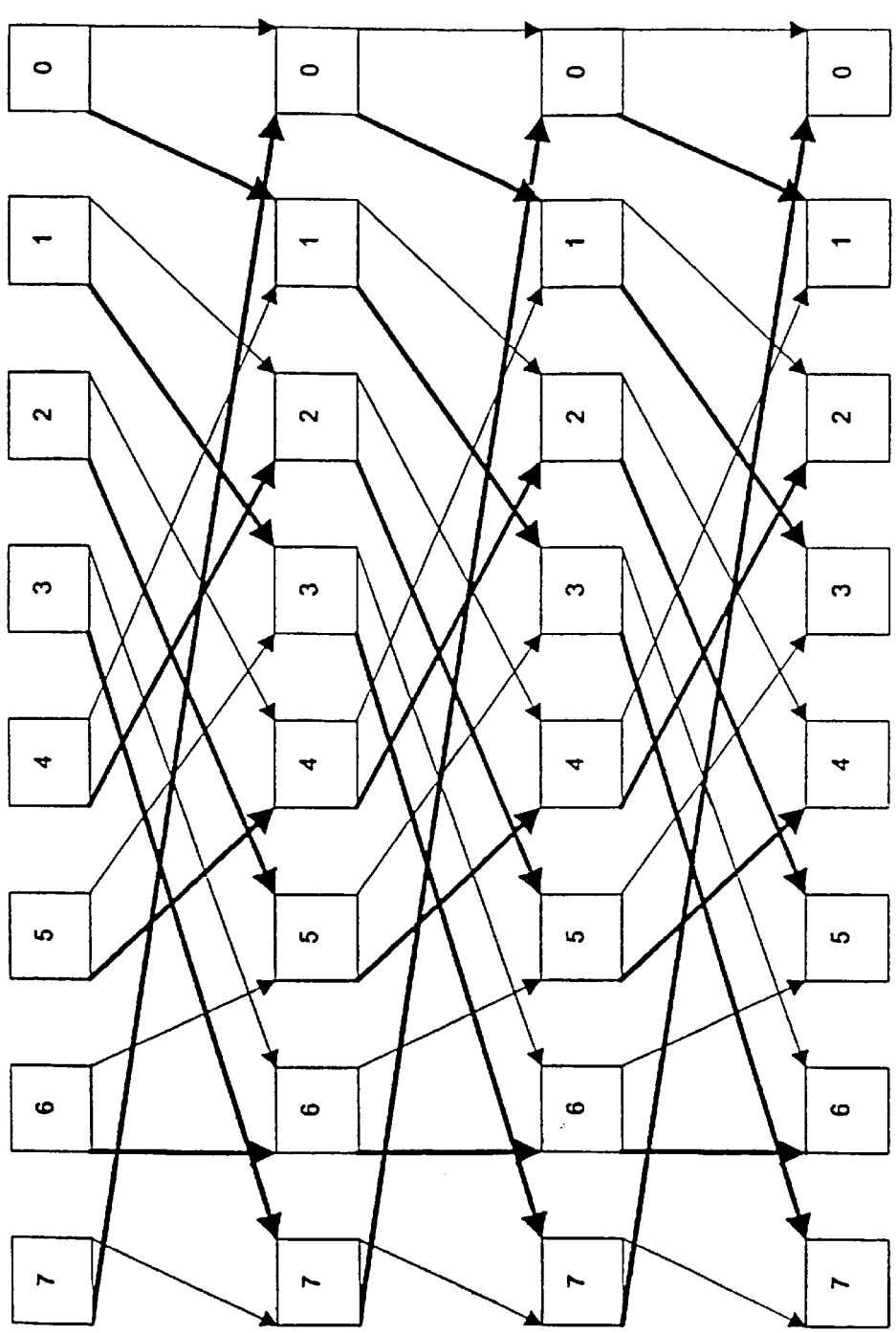
FIG. 3 illustrates the movement of the data register values for the three shift cycles in a shift left operation for an eight bit shift register according to one embodiment of the present invention.

FIG. 3 illustrates the movement of the data register values for the three shift cycles in a shift left operation for an eight bit shift register. The bold arrows indicate the shift position mapping for a count bit equal to one shift left operation. The non-bold arrows indicate the shift position mapping for a count bit equal to zero shift operation. FIG. 3 graphically illustrates the shift left position mappings defined in Table 2.

Figure 4:
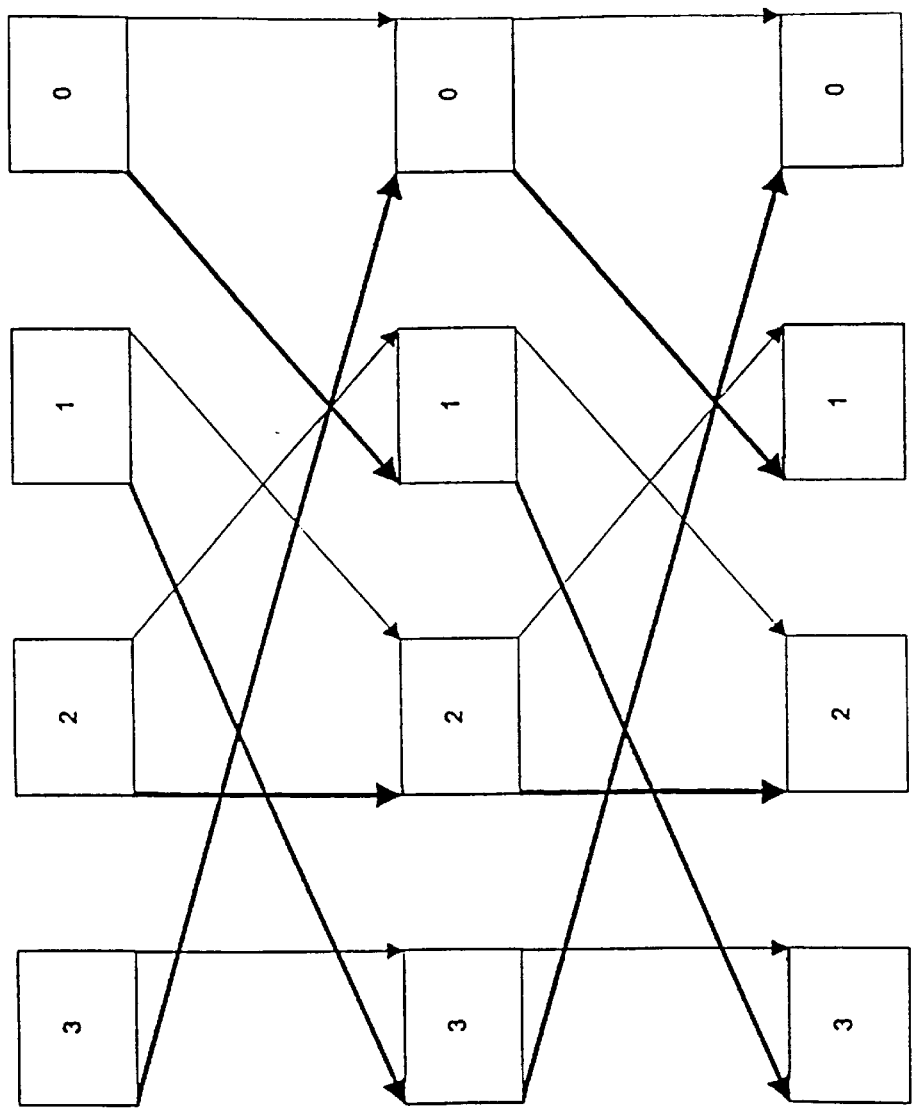
FIG. 4 illustrates the movement of the data register values for the two shift cycles in a shift right operation for a four bit shift register according to one embodiment of the present invention.

FIG. 4 illustrates the movement of the data register values for the two shift cycles in a shift right operation for a four bit shift register. As in FIG. 3, the bold arrows indicate the shift position mapping for a count bit equal to one shift left operation, and the non-bold arrows indicate the shift position mapping for a count bit equal to zero shift operation.

FIG. 5A illustrates the shift register mappings for each cycle of a shift left operation for an eight bit shift register for all of the count bit values 000 to 111. Each cell represents a shift register position, and the number in the cell indicates the shift register position contents that is in the labeled shift register position at the cycle indicated by the column. The third column in each of the tables therefore represents the shift register contents at the end of the operation. For example, the third column of Table 5A-2 illustrates the final shift register positions for a shift left one operation. Similarly, FIG. 5B illustrates the shift register mappings for each cycle of a shift left operation for a four bit shift register for all of the count bit values 00 to 11.

In addition to the shift register mapping described by FIGS. 3, 4, 5A and 5B, bits that should be shifted "out" of the shift register should be eliminated and reset to zero. For example, for a shift left four positions operation, shift register positions 0–3 should be zeroes at the end of the operation. This process is described in more detail in regard to the shift register embodiment of FIG. 2.

Figure 2:
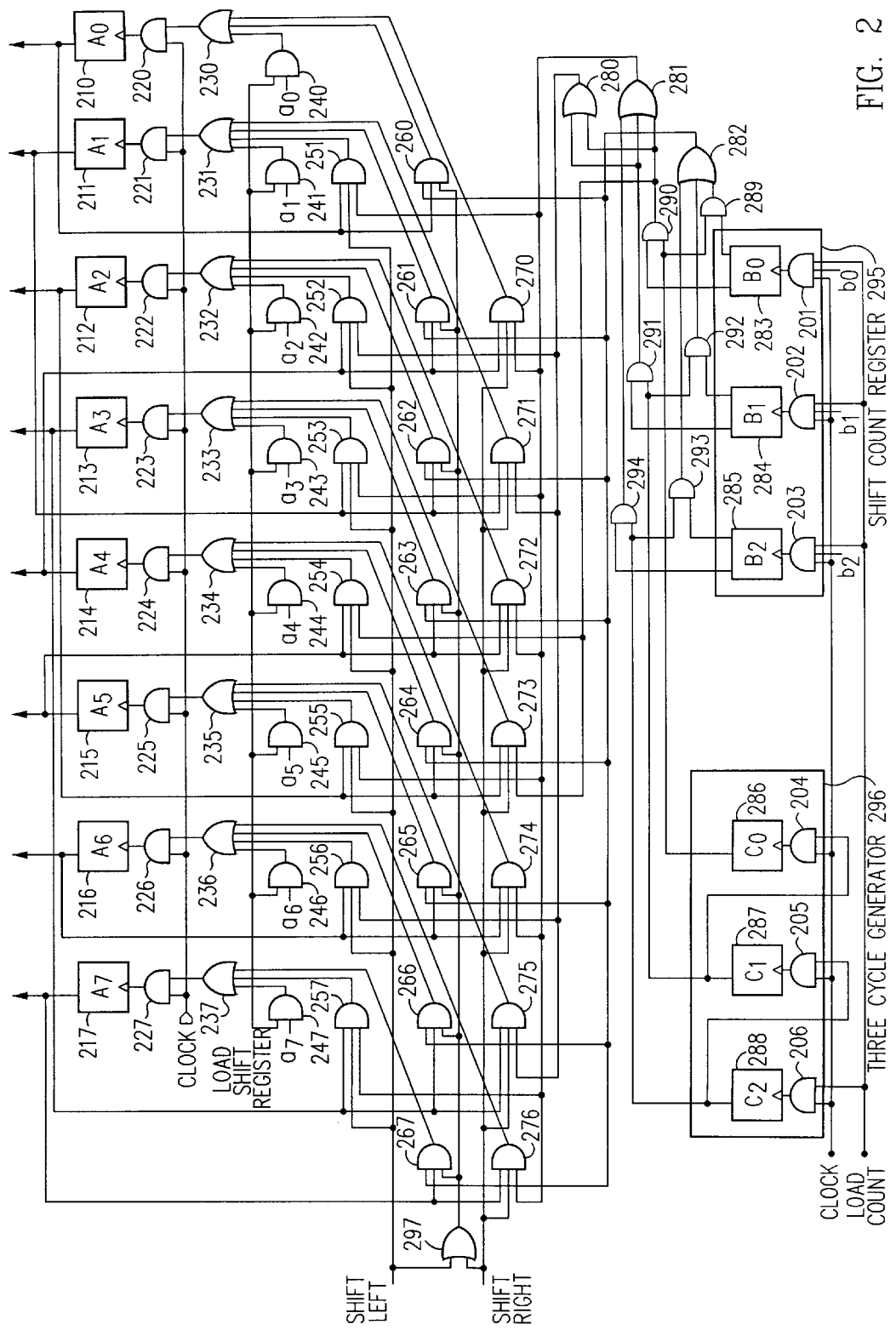
FIG. 2 illustrates a circuit diagram of an eight bit shift register according to one embodiment of the present invention.

A circuit diagram for an eight bit shift register according to one embodiment of the present invention is illustrated in FIG. 2. The shift register includes data registers $A_0$ 210–$A_7$ 217, shift count registers $B_0$ 283–$B_2$ 285, three cycle generator registers $C_0$ 286–$C_2$ 288, control logic, and control signals including shift left, shift right, load shift register, and load count signals. The initial data register values are provided by signals $a_0$–$a_7$ through AND gates 240–247. A first of three rows of AND gates 251–257 are used in shift left cycles to determine both the shift register position that a value should be shifted to as well as whether a shift register position should be zeroed out. The second row of AND gates 260–267 control the zero shift operation in both shift left and shift right operations. For zero shift operations no shift register positions are zeroed out. The third row of AND gates 270–276 are used in shift right operations to determine both the shift register position that a value should be shifted to as well as whether a shift register position should be zeroed out.

In operation the load shift register loads the values provided by signals $a_0$–$a_7$ into shift registers $A_0$ 210–$A_7$ 217. The shift left or shift right control signals then indicate the direction of the shift operation. The load count control signal then loads the $b_2$, $b_1$ and $b_0$ shift count values into shift registers $B_2$ 285, $B_1$ 284 and $B_0$ 283. The shift count values define the number of positions to shift. The load count signal also starts the three cycle generator. When the load count signal is high at a rising clock edge $C_2$ 288 outputs a logic high level signal. The output of $C_2$ 288 is coupled to one of the inputs of AND gate 205, whose output is an input to $C_1$ 287. At the next clock cycle after load count switches high, both of the inputs to AND gate 205 are high and the $C_1$ 287 output switches high. The output of $C_1$ 287 is coupled to the input of AND gate 204. Therefore at the next cycle after $C_1$ 287 switches high $C_0$ 286 switches high. The load count control signal is high for one cycle for each three cycle shift operation, therefore each of the three cycle generator registers $C_0$ 286–$C_2$ 288 output a high level signal for one cycle.

Three cycle generator 296 provides the three cycle signals for performing the three shift operations corresponding to the three shift count bits.

The operation of the eight bit shift register embodiment of FIG. 2 is illustrated using an example of a shift left operation with a 101 shift count value, which corresponds to a shift left five positions operation. When the load count signal goes high the 101 shift count values are loaded into shift count registers $B_2$ 285, $B_1$ 284 and $B_0$ 283. In the first cycle of the three cycle shift operation, the outputs of $C_2$ 288 and $B_2$ 285 switch high. With the outputs of $C_2$ 288 and $B_2$ 285 high, the output of AND gate 294 switches high which is one input to OR gate 281. OR gate 281 then switches high. With OR gate 281 high and the shift left control signal high, two of the three inputs to each of the AND gates 251, 253, 255 and 257 are high. The third input to each of the AND gates 251, 253, 255 and 257 is the value of the corresponding shift left source data register. For example, the third input to AND gate 251 is the value stored in data register $A_0$ 210. If the value from $A_0$ 210 is high then the output of the AND gate 251 is high, which causes the OR gate 231 output to switch high. With the OR gate 231 output high, AND gate 221 provides a high signal output at the next rising clock edge, which sets the value of data register $A_1$ 211 to a one. The other three AND gates 253, 255 and 257 and associated control logic operate similarly. In this manner the four low order data register values are shifted in the first cycle of the three cycle shift operation as shown in Table 2.

The four high order data register values are not shifted, instead they are replaced by zeroes since the outputs of OR gates 230, 232, 234 and 236 do not switch high during this first cycle of the shift operation because the OR gate 281 output is not connected to AND gates 252, 254 and 256. Because in this example, the most signficant bit of the shift count, $b_2$, equals one, the most significant half (the left half) of the data register contents are to be shifted out of the data register. In other words, only the least significant half of the data register contents are retained in the data registers.

In the second cycle of the three cycle 101 shift left operation, the high output of cycle register $C_2$ 288 is clocked into $C_1$ 287 which causes the $C_1$ 287 output to switch high. With the load count signal low the $C_2$ 288 output then switches low. The true output of $B_1$ 284 is coupled to an AND gate 291 input. With the $B_1$ 284 true output low the AND gate 291 output is low. The output of AND gate 291 is coupled to an OR gate 281 input. All three inputs to OR gate 281 are low which causes the OR gate 281 output to be low. With the OR gate 281 output low, the output of AND gates 251, 253, 255 and 257 are low. The output of AND gate 291 is also an input to OR gate 280. Both inputs to OR gate 280 are low which causes the OR gate 280 output to be low. With the OR gate 280 output low, the outputs of AND gates 252 and 256 are low. The output of $C_0$ 286 is coupled to an input of AND gate 290. In the second cycle, the $C_0$ 286 output is low, therefore the AND gate 290 output is low. The AND gate 290 output is coupled to an input of AND gate 254, which causes AND gate 254 to be low. Thus all of the first row AND gates 251–257 are low.

As to the second row of AND gates 260–267, the complement output of $B_1$ 284 is coupled to an input of AND gate 292. The second AND gate 292 input is coupled to $C_1$ 287. Both inputs to AND gate 292 are therefore high which causes the output to be high. The AND gate 292 output is coupled to OR gate 282 which causes the OR gate 282 output to be high. The OR gate 282 output is coupled to a first input of each of the second row AND gates 260–267. The third input to each of the second row AND gates 260–267 is coupled to the OR gate 297 output which ORs the shift left and shift right control signals. The OR gate 297 output is high. With these two inputs to each of the second row AND gates 260–267 high the output of each of these AND gates depends on the second input. The second input to each of the second row AND gates 260–267 is the source data register value for the corresponding sink data register, as defined by the zero shift mapping shown in Table 2. Thus in the second cycle of the 101 shift left operation the Table 2 zero shift mapping is implemented by the second row of AND gates 260–267.

In the third cycle of the three cycle 101 shift left operation, the high output of cycle register $C_1$ 287 is clocked into $C_0$ 286 which causes the $C_0$ 286 output to switch high. The $C_0$ 286 output and the $B_0$ 283 true output are coupled to the two AND gate 290 inputs. With the $C_0$ 286 output high and the $B_0$ 283 output high the AND gate 290 output is high. The AND gate 290 output is coupled to an OR gate 281 input, which makes the OR gate 281 output high. The OR gate 281 output is coupled to a third input of AND gates 251, 253, 255 and 257, as noted in the first cycle. The AND gate 290 output is also coupled to an OR gate 280 input which causes the OR gate 280 output to be high. The OR gate 280 output is coupled to a third input of AND gates 252 and 256. The AND gate 290 output is also coupled to the third input of AND gate 254. Thus the third input of each of the first row AND gates 251–257 is high. The second input of each of the first row AND gates 251–257 is the shift left control signal which is also high. The first input of each of the first row AND gates 251–257 is the source data register for the corresponding sink register as shown for shift left count bit equal to one in Table 2. The highest order data register value is not shifted, but is replaced by zero, for there is no AND gate to connect a left shift input to OR gate 230 when the count bit value $b_0$ is equal to one. This being the least significant bit of the shift register only a single data register value would be shifted out of the data register.

For shift register values that should be shifted "out" of the shift register, zeroes are inserted in the appropriate sink data register positions. The zeroing out process is performed based on the shift count register values in each of the three cycles in a shift operation. For a shift left operation, in the first cycle if shift count bit $b_2$ is equal to one then the inputs to data registers $A_0$ 210, $A_2$ 212, $A_4$ 214 and $A_6$ 216 are zeroed out. These four data registers are the sink positions for the outputs from the four left most data registers. As shown in Table 2, the inputs to data registers $A_0$ 210, $A_2$ 212, $A_4$ 214 and $A_6$ 216 are $A_7$ 217, $A_4$ 214, $A_5$ 215 and $A_6$ 216 respectively for a left shift in a cycle with the count bit equal to one. Similarly, in the second cycle if shift count bit $b_1$ equals one then the inputs to data registers $A_0$ 210 and $A_4$ 214 are zeroed out. In the third cycle if shift count bit $b_0$ equals one then the input to data register $A_0$ 210 is zeroed out.

The bit elimination process for a right shift is as follows: in the first cycle, if shift count bit $b_2$ is equal to one then the inputs to data registers $A_1$ 211, $A_3$ 213, $A_5$ 215 and $A_7$ 217 are zeroed out. In the second cycle, if shift count bit $b_1$ is equal to one then the inputs to data registers $A_3$ 213 and $A_7$ 217 are zeroed out. In the third cycle, if shift count bit $b_0$ is equal to one then the input to data register $A_7$ 217 is zeroed out.

The outputs of the shift count registers $B_0$ 283–$B_2$ 285 control the zeroing out process through the outputs of OR gates 280–282, and AND gate 290. Each shift count register has two outputs. The output on the left is the true value, and the output on the right is the complement value. Each of the AND gates in the three rows of AND gates 251–257, 260–267 and 270–276 has three inputs. One of these inputs is the value of the data register that may be shifted into the data register that the output of the AND gate is coupled to. A second input is either a shift left control signal, a shift right control signal, or an OR function of the shift left and shift right control signals. The third input is the output of one of the three OR gates 280–282 or the output of AND gate 290. A zero is written into a data register by making the three inputs into the corresponding OR gate 230–237 from the three rows of AND gates 251–257, 260–267 and 270–276 low. Then with the load shift register signal low, at the rising clock edge one input to the corresponding AND gate 220–227 is low and therefore a zero is written into the corresponding data register.

The following describes the data register values that are retained and the data register values that are zeroed out in an eight bit shift register three cycle shift operation. In the first cycle the four right most data register values are retained. The shift count bit $b_2$ indicates whether the shift register contents should be shifted by four positions. If the shift is a left shift and the $b_2$ shift count bit is a one, then in the first cycle of the three cycle shift operation when cycle register $C_2$ 288 is asserted, both inputs to AND gate 294 are asserted. The first input to AND gate 294 is the true value of $B_2$ 285 which is a one. The second input to AND gate 294 is the value of cycle register $C_2$ 288 which is also a one. The output of AND gate 294 is coupled to one input of OR gate 281. With AND gate 294 high, the output of OR gate 281 is high. The output of OR gate 281 is coupled to an input of AND gates 251, 253, 255, 257, 270, 272, 274, and 276. Of this group, AND gates 251, 253, 255, and 257 are in the first of the three rows of AND gates and are used in shift left operations. AND gates 270, 272, 274, and 276 are in the third row of AND gates and are used in shift right operations. In a shift left operation the second input, which is the shift left control signal, to each of the first row of AND gates 251–257 is high. The third input to AND gates 251, 253, 255, and 257 is coupled to the output of OR gate 281. The first input of the first row of AND gates 251–257 is coupled to the source data register whose contents may be shifted into the sink data register coupled to the output of the given AND gate if all the inputs of that AND gate are high. Therefore in a shift left operation when OR gate 281 is high the values in the source data registers are shifted into the destination data registers corresponding to AND gates 251, 253, 255, and 257, which corresponds to sink data registers $A_1$ 211, $A_3$ 213, $A_5$ 215 and $A_7$ 217. The source data registers corresponding to these sink data registers are $A_0$ 210, $A_1$ 211, $A_2$ 212, and $A_3$ 213 respectively. Thus in the first cycle of a shift left operation with shift count register $B_2$ 285 asserted the four right most data register values are retained.

In the first cycle of a shift left operation with $B_2$ 285 asserted the four left most data register values are zeroed out. In the first cycle of the shift left operation with $B_2$ 285 asserted, the only AND gate of the AND gates 290–294 with a high output is AND gate 294, all the other of these AND gates have a low output. Therefore the output from OR gate 281 is high while the OR gates 280 and 282 and AND gate 290 outputs are all low. As a consequence the third input of each of the AND gates 252, 254 and 256 is low, therefore their outputs cannot be high. Therefore the output of OR gates 230, 232, 234 and 236 also cannot be high. So zeroes are set into registers $A_0$ 210, $A_2$ 212, $A_4$ 214 and $A_6$ 216. In this manner, all four of the initially left most bits of the data register are zeroed out in a shift left $B_2$ 285 count bit equal to one shift cycle.

In the second cycle of a shift left operation with shift count register $B_1$ 284 asserted the inputs from data registers $A_5$ 215 and $A_7$ 217 are zeroed out. As shown in Table 2 if in the first cycle the shift count bit $b_2$ equals one, then $A_7$ 217 holds the initial $a_3$ value, and $A_5$ 215 holds the initial $a_2$ value. If shift count bit $b_2$ equals zero then $A_7$ 217 holds the initial $a_7$ value and $A_5$ 215 holds the initial $a_6$ value. The zeroed out bits are in either case the two most significant bits of the current shift register data values, since in the case where $b_2$ equals one, the initial shift register data values $a_7$, $a_6$, $a_5$ and $a_4$ would already have been zeroed out. In the second cycle $C_2$ 288 equals zero, $C_1$ 287 equals one, and $C_0$ 286 equals zero, so if $b_1$ equals one then AND gates 289, 290, 292, 293 and 294 have low outputs, but AND gate 291 has a high ouput. Therefore the OR gate 280 and 281 outputs are high. Because the output of AND gate 290 is low the third input to AND gate 254 is low, and thus the OR gate 234 output is low, which causes a zero to be inserted into $A_4$ 214. The $A_5$ 215 output is coupled to $A_4$ 214, therefore this zeroes out the data from $A_5$ 215. With $b_1$ equal to one, the OR gate 282 output is low. As a result, the output of AND gate 260 is low. The other two inputs to OR gate 230 are also low, therefore a zero is inserted into $A_0$ 210. Zeroing out $A_0$ 210 is effectively zeroing out the output of $A_7$ 217, because as shown in Table 2, $A_7$ 217 is listed as the source for $A_0$ 210 for a shift left count bit equal to one cycle. However in practice because for a shift left cycle the contents of $A_7$ 217 should be shifted out of the shift register, the $A_7$ 217 output is not coupled to $A_0$ 210.

In the third cycle of a shift left operation with shift count register $B_0$ 283 asserted the input from $A_0$ 210 is zeroed out. As described above in the second cycle of the shift left operation description, with $b_0$ equal to one, the OR gate 282 output is low. As a result, the output of AND gate 260 is low. The other two inputs to OR gate 230 are also low, therefore a zero is inserted into $A_0$ 210.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, in an alternative embodiment OR gate 297 and the corresponding AND gates inputs are removed. Also numerous other logic configurations can be used to implement the logarithmic shift register function.

What is claimed is:

1. A logarithmic shift register comprising:
   $2^n$ data registers;
   an n cycle generator;
   n shift count registers; and
   a control logic circuit, said control logic circuit coupled to said data registers, said n cycle generator, and said shift count registers, wherein said control logic circuit moves the contents of said $2^n$ data registers up to $2^n-1$ positions in n cycles.

2. The logarithmic shift register of claim 1 further comprising:
   a shift left control line;
   a shift right control line; and
   wherein said control logic further comprises for each of a plurality of said data registers:
      an AND gate coupled to said shift left control line for controlling shift left operations;
      an AND gate coupled to said shift right control line for controlling shift right operations.

3. A logarithmic shift register comprising:

a plurality of data registers;

an n cycle generator;

n shift count registers; and a control logic circuit, said control logic circuit coupled to said data registers, said n cycle generator, and said shift count registers, wherein said control logic circuit moves values in said data registers such that for a count bit equal to zero cycle a value in data register (i) is moved to data register (2i), and a value in data register ($2^{n-1}$+i) is moved to data register (2i+1), for a shift right count bit equal to one cycle, a value in data register (i) is moved to data register (2i−1), and a value in data register ($2^{n-1}$ +i) is moved to data register (2i).

4. The logarithmic shift register of claim 3 wherein said control logic circuit moves values in said data registers such that for a shift left count bit equal to one cycle a value in data register (i) is moved to data register (2i+1), and a value in data register ($2^{n-1}$+i) is moved to data register (2i+2).

5. The logarithmic shift register of claim 4 wherein said control logic circuit further comprises:

a shift left control line;

a shift right control line; and wherein said control logic further comprises for each of a plurality of said data registers:

an AND gate coupled to said shift left control line for controlling shift left operations;

an AND gate coupled to said shift right control line for controlling shift right operations.

6. A logarithmic shift register comprising:

a plurality of data registers;

an n cycle generator;

n shift count registers; and a control logic circuit, said control logic circuit coupled to said data registers, said n cycle generator, and said shift count registers, wherein said control logic circuit moves values in said data registers such that for a count bit equal to zero cycle a value in data register (i) is moved to data register (2i), and a value in data register ($2^{n-1}$+i) is moved to data register (2i+1), for a shift left count bit equal to one cycle a value in data register (i) is moved to data register (2*i*+1), and a value in data register ($2^{n-1}$+i) is moved to data register (2i+2).

7. A method of shifting the contents of a shift register comprising the steps of:

(a) defining count bits;

(b) moving, for a count bit equal to zero cycle, a value in data register (i) to data register (2i), and moving a value in data register ($2^{n-1}$+i) to data register (2i+1); and (c) moving, for a shift right count bit equal to one cycle, a value in data register (i) to data register (2i−1), and moving a value in data register ($2^{n-1}$+i) to data register (2i).

8. The method of claim 7 further comprising the step of:

(d) moving, for a shift left count bit equal to one cycle, a value in data register (i) to data register (2i+1), and moving a value in data register ($2^{n-1}$+i) to data register (2i+2).

9. The method of claim 8 further comprising the steps of:

(e) repeating step (b) for each register position and for each count bit that is zero;

(f) repeating step (c) for each register position and for each count bit that is one in a shift right operation; and (g) repeating step (d) for each register position and for each count bit that is one in a shift left operation.

10. The method of claim 8 wherein said method shifts the values of a $2^n$ bit shift register up to $2^{n-1}$ register positions in n cycles.

11. A method of shifting the contents of a shift register comprising the steps of: (a) defining count bits;

(b) moving, for a count bit equal to zero cycle, a value in data register (i) to data register (2i), and moving a value in data register ($2^{n-1}$+i) to data register (2i+1); and (c) moving, for a shift left count bit equal to one cycle, a value in data register (i) to data register (2i+1), and moving a value in data register ($2^{n-1}$+i) to data register (2i+2).

12. The method of claim 11 further comprising the step of:

(d) zeroing out a number of data register values equal to the number of data register positions of the shift operation.

* * * * *